United States Patent
Cai et al.

(10) Patent No.: US 8,992,052 B2
(45) Date of Patent: Mar. 31, 2015

(54) INNER LENS OPTICS FOR OMNIDIRECTIONAL LAMP

(75) Inventors: Dengke Cai, Mayfield Heights, OH (US); Jeyachandrabose Chinniah, Willoughby Hills, OH (US); Glenn Howard Kuenzler, Beachwood, OH (US)

(73) Assignee: GE Lighting Solutions, LLC, East Cleveland, OH (US)

( * ) Notice: Subject to any disclaimer, the term of this patent is extended or adjusted under 35 U.S.C. 154(b) by 95 days.

(21) Appl. No.: 13/566,623

(22) Filed: Aug. 3, 2012

(65) Prior Publication Data
US 2014/0036496 A1    Feb. 6, 2014

(51) Int. Cl.
*F21V 7/00*    (2006.01)
*G02B 19/00*   (2006.01)
*F21K 99/00*   (2010.01)

(52) U.S. Cl.
CPC ............ *G02B 19/0028* (2013.01); *F21K 9/135* (2013.01)
USPC ............ 362/308; 362/327; 362/334; 359/728

(58) Field of Classification Search
CPC . F21K 9/135; F21Y 2101/02; G02B 19/0028; G02B 19/0061
USPC .................... 362/308, 334, 335, 327; 359/728
See application file for complete search history.

(56) References Cited

U.S. PATENT DOCUMENTS

| | | |
|---|---|---|
| 6,543,911 B1 | 4/2003 | Rizkin et al. |
| 6,951,418 B2 | 10/2005 | Rizkin et al. |
| 8,220,959 B2 | 7/2012 | Rizkin et al. |
| 2007/0263390 A1 * | 11/2007 | Timinger et al. ............. 362/308 |
| 2009/0129097 A1 | 5/2009 | Ewert et al. |
| 2010/0123397 A1 | 5/2010 | Tian |
| 2011/0170299 A1 | 7/2011 | Takase |

FOREIGN PATENT DOCUMENTS

EP    1388844 A1    8/2003

OTHER PUBLICATIONS

PCT Invitation to Pay Additional Fees dated Sep. 23, 2013 from corresponding Application No. PCT/US2013/048023.

* cited by examiner

*Primary Examiner* — Stephen F Husar
(74) *Attorney, Agent, or Firm* — GE Global Patent Operation; Peter T. DiMauro

(57) ABSTRACT

An optical element for a lamp or lighting apparatus having at least one light emitting diode (LED) as a light source is provided. The optical element is positioned proximate to the LED and receives light rays therefrom. In turn, the optical element distributes the substantially unidirectional light output from the LED into an omnidirectional output with a controlled variance in light intensity at different directions about the LED. A diffuser can also be used around the optical element and LED to provide further distribution of the light rays by e.g., light scattering.

18 Claims, 8 Drawing Sheets

INNER LENS OPTICS FOR OMNIDIRECTIONAL LAMP

FIELD OF THE INVENTION

The subject matter of the present disclosure relates generally to lighting devices and, more particularly, to lighting devices using one or more LEDs as a light source and an optical element to provide an improved distribution of light.

BACKGROUND OF THE INVENTION

Conventional incandescent lamps such as the common A19 bulb size typically provide a relatively uniform distribution of light. Specifically, the intensity of light measured at a fixed distance but at different angles from a centerline axis through the bulb is relatively constant. In addition to consumer appeal, this uniformity may be necessary for certain applications.

As compared to incandescent lamps, other types of light emitting devices are available that have certain advantages. For example, light emitting diodes (LEDs) can provide a light output comparable to an incandescent lamp but at a significantly improved energy efficiency. Additionally, the lifetime of an LED lamp can be substantially longer than an incandescent lamp.

The LEDs can be configured in a lamp that includes a threaded base (sometimes referred to as an "Edison base") such that it is interchangeable with conventional incandescent lamps. A diffuser can also be provided that, in addition to light scattering, can provide an LED lamp with a shape similar to that of conventional incandescent lamps. The color and intensity of light provided by the LED can also be similar to incandescent lamps.

However, certain challenges remain for the use of non-incandescent lamps. For example, LED lamps require an associated circuit board and generate significantly more heat than an incandescent lamp of comparable light output. In addition, LEDs act close to lambertian sources and thus they alone typically do not provide a uniformly distributed omni-directional light output. LED devices are usually flat-mounted on a circuit board such that the light output is substantially along a line perpendicular to the plane of the circuit board.

As such, the circuit board and heat management features contribute to the optical losses different along each direction causing the non-uniformity of the light distribution from the LEDs. Providing more energy to the LEDs can increase the amount of light output, but still may not provide uniformity. However, this also increases the amount of heat generated, which will degrade LED performance unless additional thermal management is undertaken such as larger cooling features. Yet, the size of the overall lamp may be limited depending upon the intended application or conventional lamp form desired.

Accordingly, an optical element or lens for more uniformly distributing the light from a source that includes one or more LEDs or alternatively chip-on-board LED having tightly packed multiple chips together would be useful. More particularly, an optical element that can provide lighting having smaller variations in light intensity but varying angles from the LEDs would be beneficial. A lighting apparatus or lamp incorporating such an optical element would also be useful.

BRIEF DESCRIPTION OF THE INVENTION

The present invention provides an optical element for a lamp or lighting apparatus having at least one light emitting diode (LED) as a light source. Alternatively the source could be a Chip-On-Board (COB) LED which has closely packed multiple LED dies. The optical element is positioned proximate to the LED and receives light rays therefrom. In turn, the optical element distributes the substantially unidirectional (lambertian) light output from the LED into an omnidirectional output with a controlled variance in light intensity at different locations about the LED. A diffuser can also be used around the optical element and LED to provide further distribution of the light rays by e.g., light scattering. Additional aspects and advantages of the invention will be set forth in part in the following description, or may be apparent from the description, or may be learned through practice of the invention.

In one exemplary embodiment, the present invention provides a lighting apparatus that includes at least one light emitting diode and an optical element positioned adjacent to the at least one light emitting diode. The optical element defines a central axis and a lateral axis that is substantially orthogonal to the central axis. The optical element extends circumferentially about the central axis and includes a convex light receiving surface that is substantially symmetrical about the central axis and positioned adjacent to the at least one light emitting diode; a frustoconical light projecting surface positioned laterally outside of the convex light receiving surface and substantially symmetrical about the central axis; and an arcuate light reflecting surface positioned laterally inside of the frustoconical light projecting surface and substantially symmetrical about the central axis, the arcuate light reflecting surface spaced apart along the central axis from the convex light receiving surface.

In another exemplary embodiment, the present invention provides a lighting apparatus that includes at least one light emitting diode and an optical element positioned adjacent to the at least one light emitting diode. The optical element defines a central axis and a lateral axis that is substantially orthogonal to the central axis. The optical element extends circumferentially about the central axis and includes a light receiving surface that is substantially symmetrical about the central axis and positioned adjacent to the at least one light emitting diode, the light receiving surface forming an acute angle with the central axis; a light projecting surface that is substantially symmetrical about the central axis and spaced apart from the light receiving surface along the central axis; a frustoconical surface connected with the light projecting surface and substantially symmetrical about the central axis; and an arcuate light reflecting surface positioned laterally inside of the frustoconical surface and substantially symmetrical about the central axis, the arcuate light reflecting surface spaced apart along the central axis from the light receiving surface.

In still another exemplary embodiment, the present invention provides an optical element for a lighting apparatus having at least one light emitting diode. The optical element for positioning adjacent to the at least one light emitting diode. The optical element defines a central axis and a lateral axis that is substantially orthogonal to the central axis. The optical element extends circumferentially about the central axis. The optical element includes a light receiving surface that extends circumferentially about the central axis and is configured for positioning near the at least one light emitting diode. A frustoconical surface is spaced apart from the light receiving surface along the transverse direction and extends circumferentially about the central axis and is substantially symmetrical about the central axis. An arcuate light reflecting surface is positioned laterally inside of the frustoconical surface and extends circumferentially about the central axis and is substantially symmetrical about the central axis. The optical element is configured so that light from the at least one light emitting diode is emitted from the optical element with variation in light intensity measured at a fixed distance from central axis CA over the range of zero to 135 degrees that is not more than±twenty percent from the average light intensity measured from zero to 135 degrees.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION OF THE INVENTION

Figure 1:
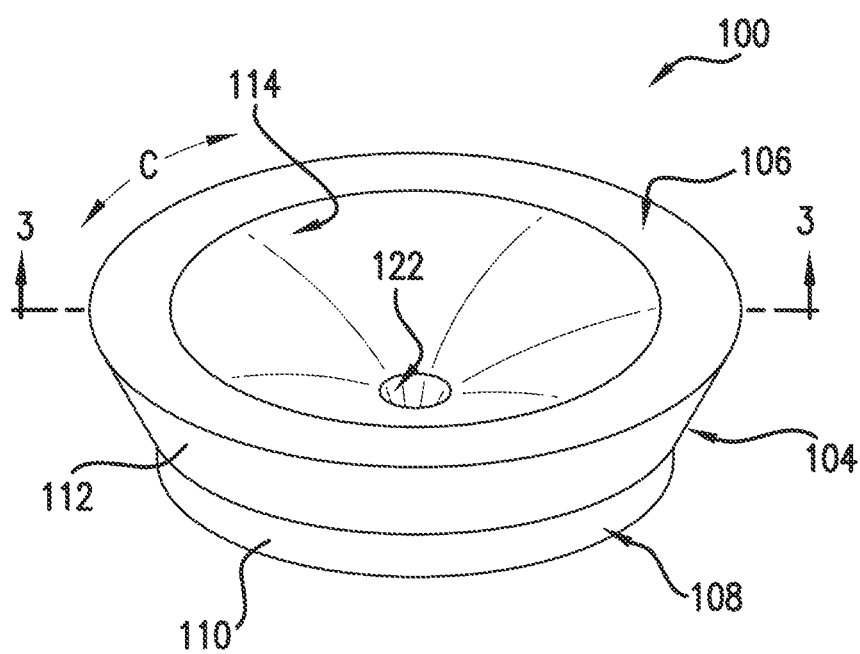
FIG. 1 provides a perspective view of an exemplary embodiment of an optical element of the present invention.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

An exemplary embodiment of a lens or optical element 100 of the present invention is shown in FIGS. 1 through 4. The optical element 100, including certain surfaces as will be further described, is substantially symmetrical about a central axis CA and extends along circumferential direction C about central axis CA. For purposes of further describing this exemplary embodiment of the invention, optical element 100 defines a lateral direction L that extends substantially orthogonal to central axis CA. Optical element 100 may comprise a light transmissive material such as e.g., a glass, a polymer such as polycarbonate or an acrylic, or other light transmissive materials.

Figure 4:
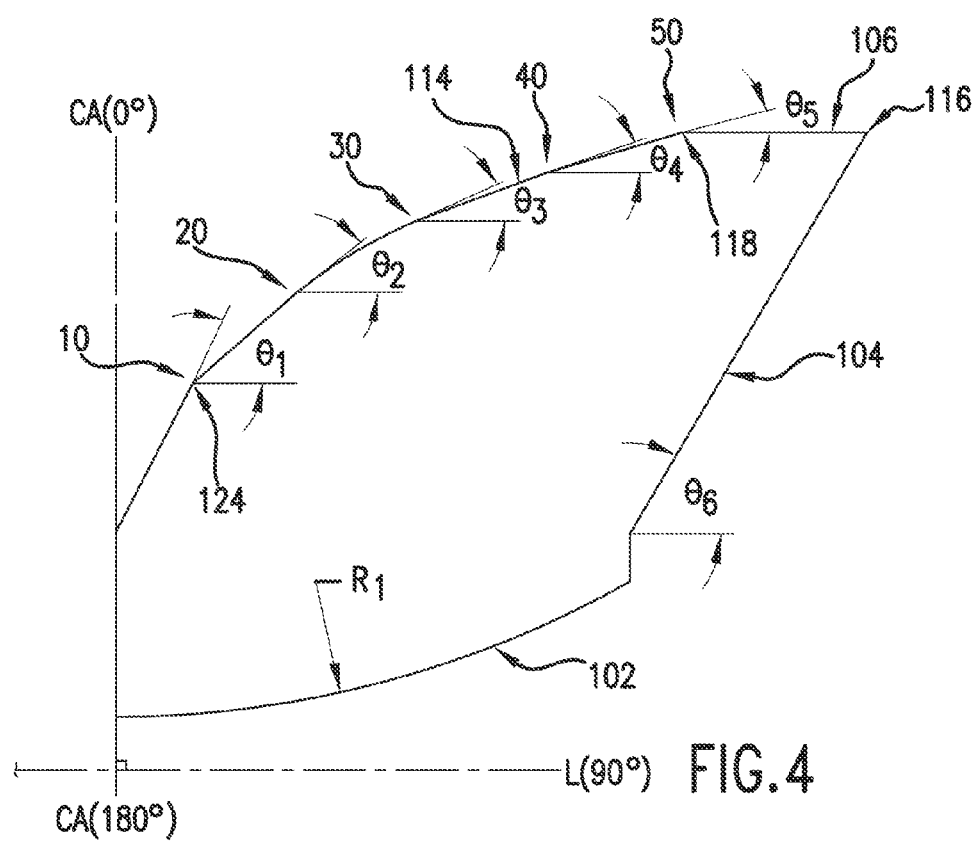
FIG. 4 is a schematic view, along one side of central axis CA, of the exterior surface for the exemplary embodiment of FIG. 1.
Figure 5:
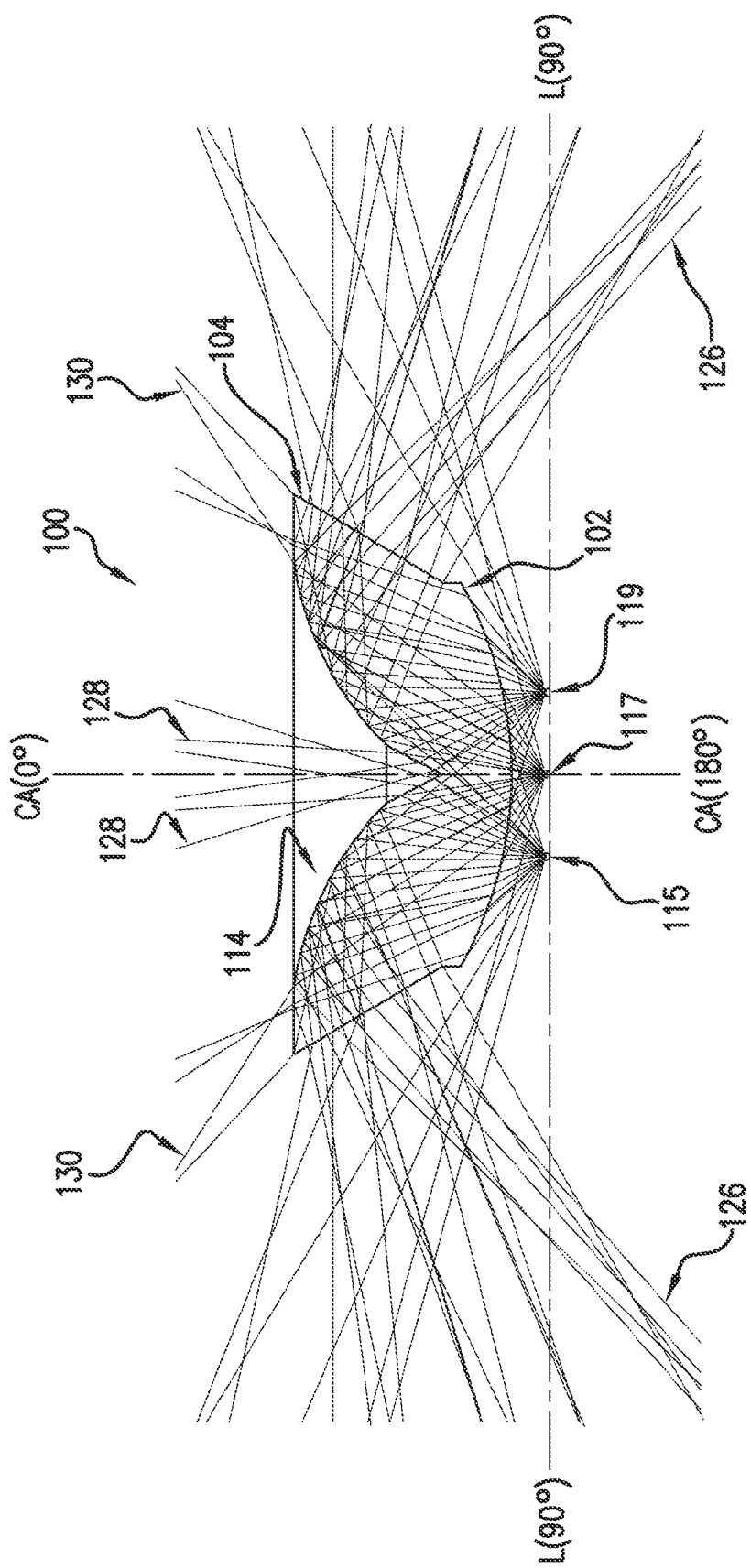
FIG. 5 is a schematic view representing the effect of the exemplary optical element of FIG. 1 on light rays from certain light sources as further described herein.

Optical element 100 includes a convex light receiving surface 102. In a lighting apparatus such as a lamp, convex light receiving surface 102 would be positioned adjacent to, or in close proximity to, one or more LEDs and would allow light rays from such light source(s) to travel into optical element 100 (FIG. 5). Convex light receiving surface 102 extends circumferentially, and is substantially symmetrical about, central axis CA. As indicated in FIG. 4, for this exemplary embodiment, convex light receiving surface is defined by a radius $R_1$ of about 11.75 mm. Other values for radius $R_1$ may be used as well.

Convex light receiving surface 102 is part of a cylindrical portion 110 of optical element 102. Cylindrical portion 110 includes a cylindrically-shaped surface 108 that is linear when viewed along the cross-section shown in FIG. 3. The length of cylindrical portion 110 along central axis CA may be varied to yield still other embodiments of the present invention.

Optical element 100 also includes a trumpet-shaped portion 112 that is adjacent to cylindrical portion 110 along the direction of central axis CA. Trumpet-shaped portion 112 includes frustoconical light projecting surface 104 that is positioned laterally outside of convex light receiving surface 102. Surface 104 extends circumferentially around, and is substantially symmetrical about, central axis CA of optical element 100. As shown in FIG. 4, for this exemplary embodiment, frustoconical light projecting surface 104 forms an acute angle with central axis CA and forms an angle $\theta_6$ with respect to lateral direction L. In one exemplary embodiment, angle $\theta_6$ form an angle in the range of about 50 degrees to about 70 degrees from lateral direction L. In another exemplary embodiment, angle $\theta_6$ is about 60 degrees.

Trumpet-shaped portion 112 also includes an arcuate light reflecting surface 114 that is positioned laterally inside of frustoconical light projecting surface 104. Surface 114 extends circumferentially around, and is substantially symmetrical about, central axis CA of optical element 100. Although shown as free form curve, arcuate light reflecting surface 114 can also be described with reference to angles $\theta_1$, $\theta_2$, $\theta_3$, $\theta_4$, and $\theta_5$ of FIG. 4. Each such angle $\theta_i$, represents the angle relative to lateral direction L of a line tangent to surface 114 at locations 10, 20, 30, 40, and 50. Locations 10, 20, 30, 40, 50 lie in a plane that includes central axis CA and lateral direction L and are spaced apart from each at equal distances along surface 114.

For one exemplary embodiment, $\theta_1$ is about 63 degrees, $\theta_2$ is about 38 degrees, $\theta_3$ is about 24 degrees, $\theta_4$ is about 19 degrees, and 74 $_5$ is about 14 degrees. In still another exemplary embodiment, $\theta_1$ is in the range of about 50 degrees to about 70 degrees, $\theta_2$ is in the range of about 30 degrees to about 50 degrees, $\theta_3$ is in the range of about 20 degrees to about 30 degrees, $\theta_4$ is in the range of about 10 degrees to about 30 degrees, and $\theta_5$ is in the range of about 10 degrees to about 30 degrees. Other shapes may be used for arcuate light reflecting surface 114 as well.

Figure 2:
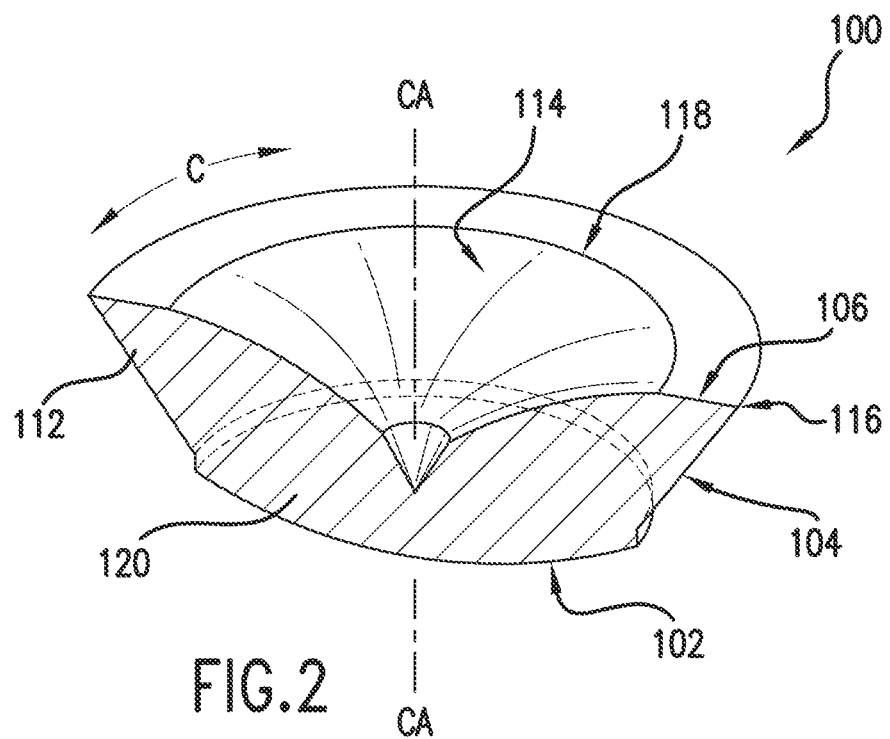
FIG. 2 provides a cross-sectioned, perspective view of the exemplary embodiment of FIG. 1.
Figure 3:
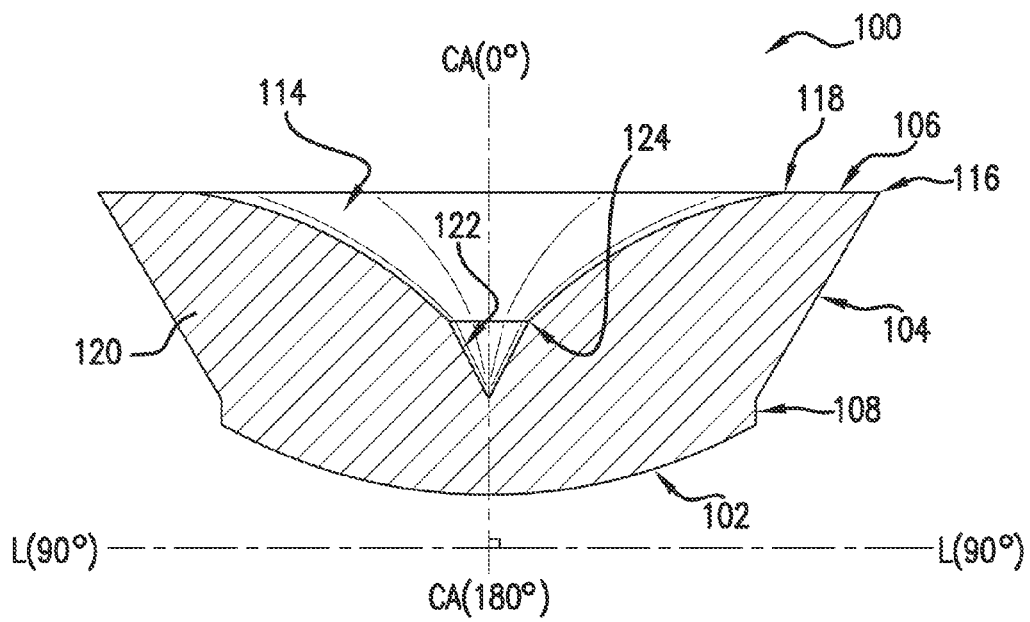
FIG. 3 is a cross-sectional view of the exemplary embodiment of FIG. 1 taken along line 3-3 of FIG. 1.

As shown in FIGS. 1 through 3, optical element 100 also includes a planar light projecting surface 106 that lies in a plane substantially perpendicular to central axis CA and substantially parallel to lateral axis L. Planar light projecting surface 106 is connected with frustoconical light projecting surface 104 at an edge 116 that extends circumferentially about central axis CA and is substantially symmetrical about central axis CA. Planar light projecting surface 106 is also connected with arcuate light reflecting surface 114 at an edge 118 that extends circumferentially about central axis CA, is substantially symmetrical about central axis CA, and is positioned laterally inward of edge 116. Edge 118 is coincident with location 50 (FIG. 4).

Optical element 100 includes a conically-shaped surface 122 that is configured in a substantially symmetrical manner about central axis CA and is connected to arcuate light reflecting surface 114 at edge 124. As shown, surface 122 opens along central axis CA in the direction of zero degrees. Edge 124 is coincident with location 10.

Arcuate light reflecting surface 114 may be covered or coated with a highly reflective material different than the material used for the construction of body 120 of optical element 100. For example, surface 114 may be metallized or covered with a coating of e.g., aluminum, silver, or other reflective metal. Other materials and/or techniques may be used as well. Similarly, conically-shaped surface 122 may also be covered or coated with a highly reflective material different than the material used for the construction of body 120.

FIG. 5 represents the simulated results obtained by placing optical element 100 closely adjacent to three light sources comprising LEDs 115, 117, and 119. Alternatively, multiple light sources can be replaced by a chip-on-board (BOC) LED having multiple dies. By way of example, light rays 126 pass through convex light receiving surface 102, pass through the material of body 120, and are reflected off of arcuate light reflecting surface 114 at different angles. Light rays 128 pass through convex light receiving surface 102 and then pass through conically-shaped surface 122 at different angles. Some light rays 130 pass through convex light receiving surface 102 and then exit optical element 100 through planar light projecting surface 106.

Figure 13:
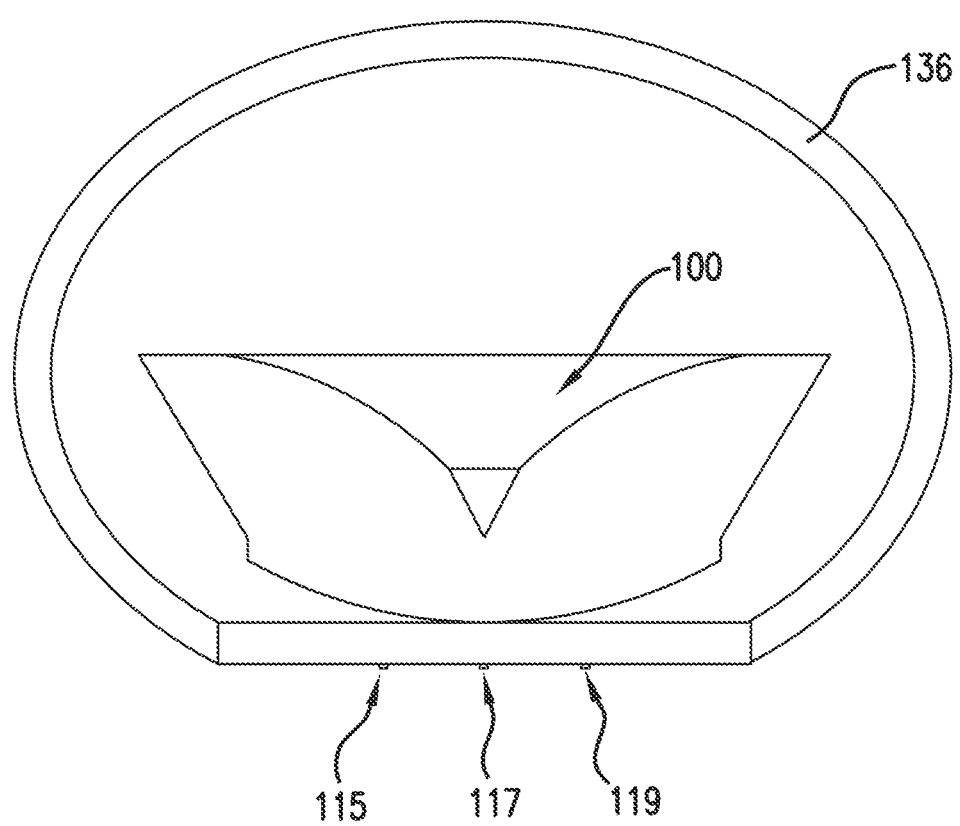
FIG. 13 is a perspective view of the exemplary optical element and LEDs of FIG. 5 with an exemplary diffuser.

A lighting apparatus incorporating optical element 100 and one or more LEDs 115, 117, and 119 positioned adjacent thereto may also include a diffuser 136 as shown in FIG. 13. More particularly, diffuser 136 may be placed around optical element 100 to provide further scattering of the lights rays from the LED(s) and optical element 100 as will be understood by those skilled in the art. Diffuser 136 may, for example, by a constructed from a diffusive plastic material with low light absorption losses or as a glass bulb containing a phosphor and positioned around optical element 100 and one or more LEDs. Diffuser 136 may e.g., connect to heat sink and/or threaded (e.g., Edison) base (not shown).

Figure 6:
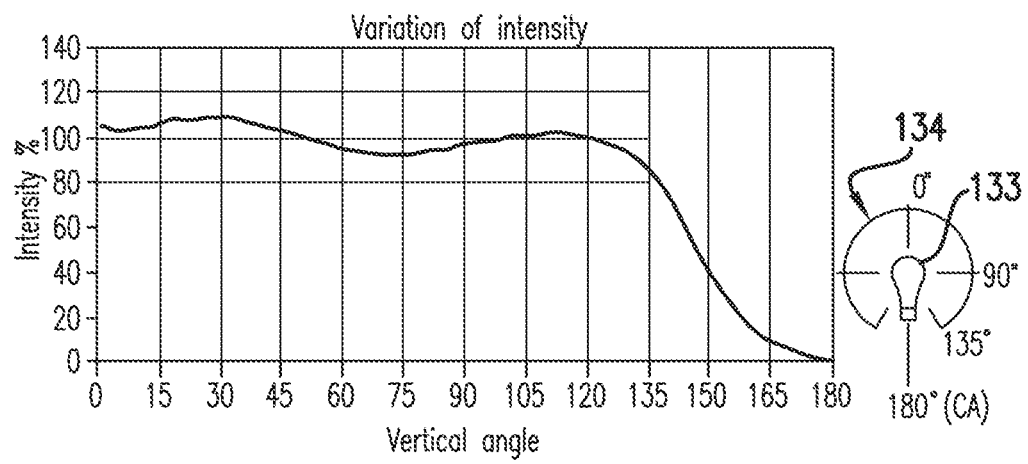
FIG. 6 is a graph depicting light intensity as a function of position for the exemplary embodiment of FIG. 1 as will be further described herein.

Optical element 100 is configured to provide a more uniform distribution of light than is available from an LED light source, which provides substantially a single direction light output. More specifically, FIG. 6 provides a simulated plot of light intensity (e.g., in candela) as a function of vertical angle from central axis CA for optical element 100. Using lamp 133 for example, the plot represents the light intensity at angles from zero degrees to 180 degrees from central axis CA as shown (zero degrees and 180 degrees being coincident with central axis CA). As depicted in FIG. 6, for the exemplary embodiment of optical element 100, the surfaces described above are configured so that the variation in light intensity measured at any distance from central axis CA over the range of zero to 135 degrees is not more than±twenty percent from the average light intensity measured from zero to 135 degrees. In another exemplary embodiment, such variation in light intensity is not more than±ten percent from the average light intensity at angles measured from zero to 150 degrees.

Figure 7:
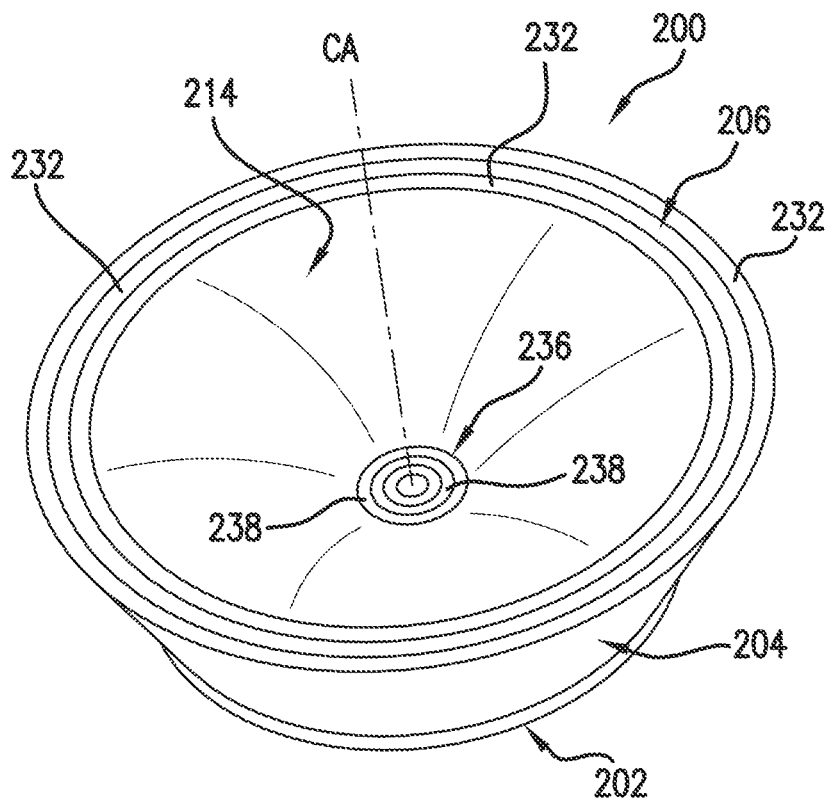
FIG. 7 is a perspective view of another exemplary embodiment of the present invention.
Figure 8:
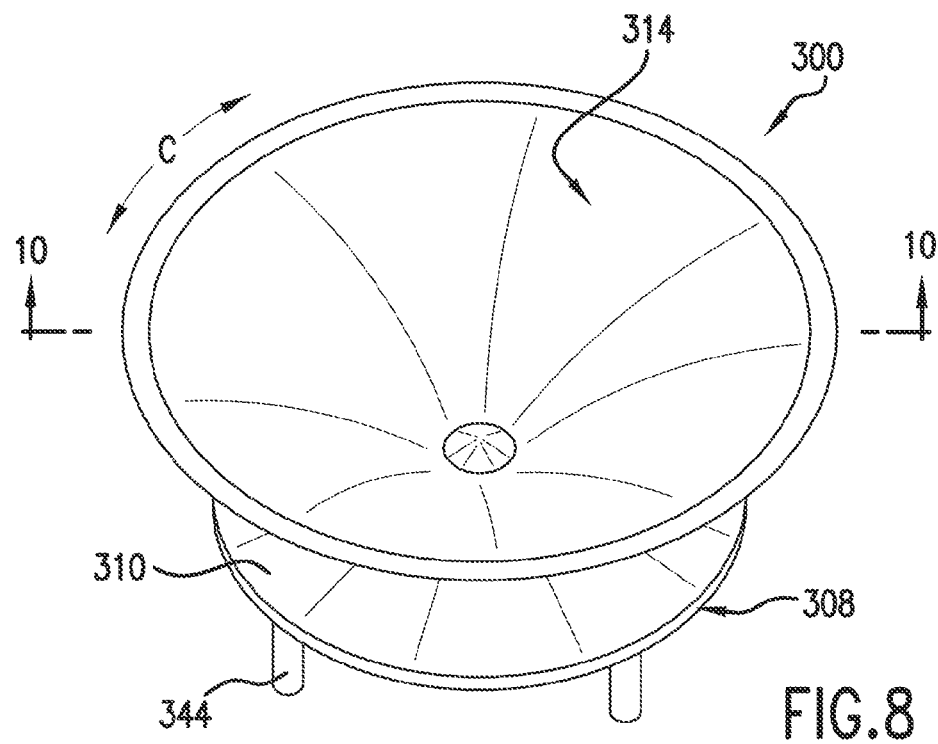
FIG. 8 is a perspective view of another exemplary embodiment of an optical element of the present invention.
Figure 9:
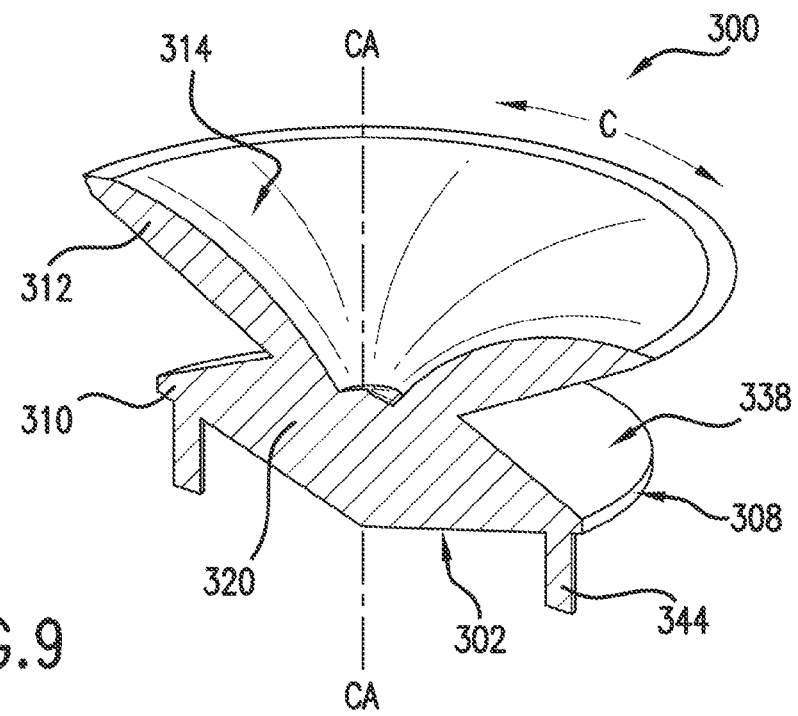
FIG. 9 provides a cross-sectioned, perspective view of the exemplary embodiment of FIG. 8.

FIG. 7 provides a perspective view of another exemplary embodiment of an optical element 200 of the present invention similar to the exemplary embodiment of FIGS. 1-4 in that it includes convex light receiving surface 102, frustoconical light projecting surface 204, and arcuate light reflecting surface 214. However, optical element 200 includes curved flutes 232 on light projecting surface 206 that extend in a substantially symmetrical manner about central axis CA and are circumferential about central axis CA. Additionally, a circular surface 236 located at central axis CA also includes a plurality of flutes 238 that extend in a substantially symmetrical manner about central axis CA and are circumferential about central axis CA. Flutes 232 and 238 provide additional light scattering. Other surface features such as e.g., pillows may also be used to provide additional light scattering.

Figure 10:
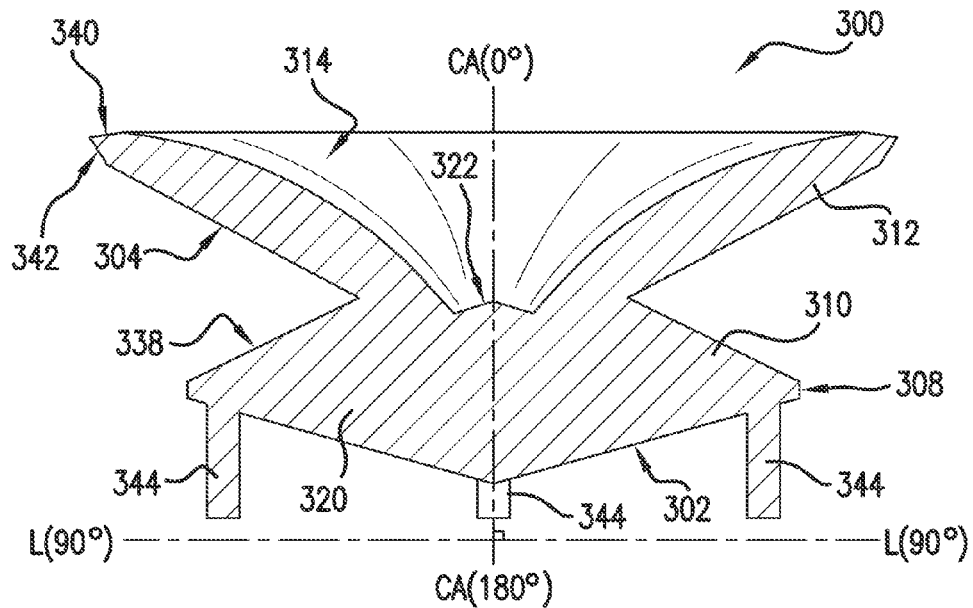
FIG. 10 is a cross-sectional view of the exemplary embodiment of FIG. 8 taken along line 10-10 of FIG. 10.
Figure 11:
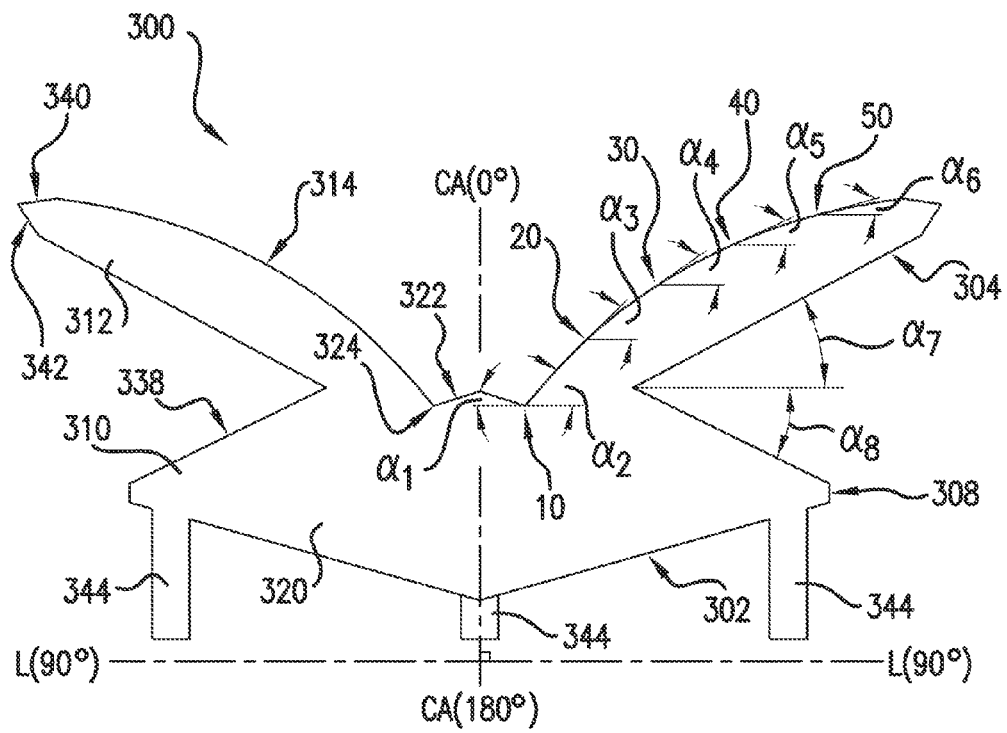
FIG. 11 is a schematic view of the exterior surface for the exemplary embodiment of FIG. 8.
Figure 12:
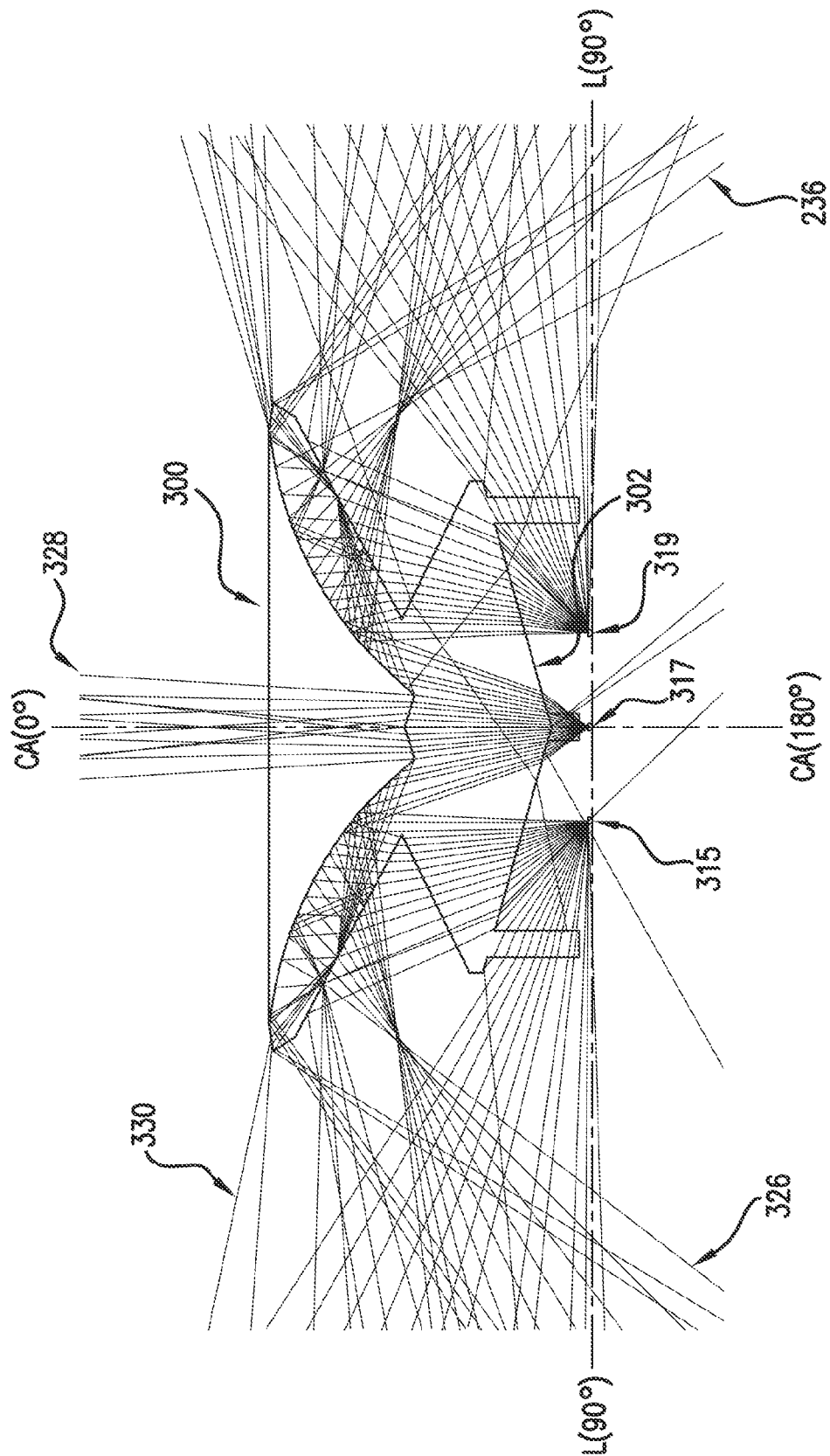
FIG. 12 is a schematic view representing the effect of the optical element of FIG. 8 on light rays from certain light sources as further described herein.

Another exemplary embodiment of an optical element 300 of the present invention is shown in FIGS. 8, 9, 10, and 11. FIG. 12 illustrates this exemplary embodiment in conjunction with LEDs 315, 317, and 319. Optical element 300, including certain surfaces as will be further described, is substantially symmetrical about a central axis CA and extends along circumferential direction C about central axis CA. For purposes of further describing this exemplary embodiment of the invention, optical element 300 also defines a lateral direction L that extends substantially orthogonal to central axis CA. Optical element 300 is constructed from a light transmissive material such as e.g., a glass, a polycarbonate, an acrylic, or other light transmissive materials.

Optical element 300 includes a disc-shaped portion 310 and a trumpet-shaped portion 312. Disc-shaped portion 310 includes a light receiving surface 302. As shown, surface 302 is conical in shape and forms an acute angle with the central axis CA. However, light receiving surface 302 could also be curved in a convex manner. In a lighting apparatus such as a lamp, light receiving surface 302 would be positioned adjacent to, or in close proximity to, one or more LEDs and would allow light rays from such light source(s) to travel into optical element 300 (FIG. 12). Light receiving surface 302 extends circumferentially, and is substantially symmetrical about, central axis CA.

Disc-shaped portion 310 includes a cylindrically-shaped surface 308 that is linear when viewed along the cross-section shown in FIG. 10. The length of disc-shaped portion 310 along central axis CA may be varied to yield still other embodiments of the present invention. A light projecting surface 338 is connected to surface 308 and spaced apart from light receiving surface 302 along the direction of the central axis CA as shown. For the exemplary embodiments shown, light projecting surface 338 is frustoconical in shape. However, surface 328 may also be arcuate or convex in other embodiments of the invention. As shown in FIG. 11, for this exemplary embodiment, surface 338 forms an obtuse angle with central axis CA and forms an acute angle $\alpha_8$ with respect to lateral direction L. In one exemplary embodiment, angle $\alpha_8$ is about 25 degrees. In another exemplary embodiment, angle $\alpha_8$ is in the range of about 20 degrees to about 30 degrees.

Trumpet-shaped portion 312 is adjacent to disc-shaped portion 310 along the direction of central axis CA. Trumpet-shaped portion 312 includes frustoconical surface 304 that connected with light projecting surface 338. Surface 304 extends circumferentially around, and is substantially symmetrical about, central axis CA of optical element 300 and is spaced apart along central axis CA from surface 338. As shown in FIG. 11, for this exemplary embodiment, frustoconical surface 304 forms an acute angle with central axis CA and forms an angle $\alpha_7$ with respect to lateral direction L. In one exemplary embodiment, angle $\alpha_7$ is about 28 degree from lateral direction L. In another exemplary embodiment, angle $\alpha_7$ is in the range of about 23 degrees to about 33 degrees from lateral direction L.

Trumpet-shaped portion 312 also includes an arcuate light reflecting surface 314 that is positioned laterally inside of frustoconical surface 304. Surface 314 extends circumferentially around, and is substantially symmetrical about, central axis CA of optical element 300. Although shown as free form curve, arcuate light reflecting surface 314 can also be described with reference to angles $\alpha_2$, $\alpha_3$, $\alpha_4$, $\alpha_5$, and $\alpha_6$ of FIG. 11. Each such angle $\alpha_i$, represents the angle relative to lateral direction L of a line tangent to surface 314 at locations 10, 20, 30, 40, and 50 as shown in FIG. 11. Locations 10, 20, 30, 40, 50 lie in a plane that includes central axis CA and lateral direction L and are spaced apart from each at equal distances along surface 314.

For one exemplary embodiment, $\alpha_2$ is about 51 degrees, $\alpha_3$ is about 43 degrees, $\alpha_4$ is about 33 degrees, $\alpha_5$ is about 23 degrees, and $\alpha_6$ is about 15 degrees. In still another exemplary embodiment, $\alpha_2$ is in the range of about 46 degrees to about 56 degrees, $\alpha_3$ is in the range of about 38 degrees to about 48 degrees, $\alpha_4$ is in the range of about 28 degrees to about 38 degrees, $\alpha_5$ is in the range of about 18 degrees to about 28 degrees, and $\alpha_6$ is in the range of about 10 degrees to about 20 degrees. Other shapes may be used for surface 114 as well.

As shown in FIGS. 10 and 11, optical element 300 also includes a pair of adjacent frustoconical surfaces 340 and 342 that are substantially symmetrical about central axis CA and extend circumferentially about central axis CA. Surface 340 and 342 are connected between arcuate light reflecting surface 314 and frustoconical surface 304.

Optical element 300 includes a conically-shaped surface 322 that is located in a substantially symmetrical manner along central axis CA and is connected to arcuate light reflecting surface 314 at edge 324. As shown, surface 322 projects along central axis CA in the direction of zero degrees. Edge 324 is coincident with location 10.

Arcuate light reflecting surface 314 may be covered or coated with a highly reflective material different than the material used for the construction of body 320 of optical element 300. For example, surface 314 may be metallized or covered with a coating of e.g., aluminum, silver, or other reflective metal. Other materials and/or techniques may be used as well. Similarly, conically-shaped surface 322 may also be covered or coated with a highly reflective material different than the material used for the construction of body 320.

FIG. 12 represents the simulated results obtained by placing optical element 100 closely adjacent to three light sources comprising LEDs 315, 317, and 319. By way of example, light rays 326 pass through light receiving surface 302, pass through the material of body 120, through surfaces 338 and 304, and are reflected off of arcuate light reflecting surface 314 at different angles. Light rays 328 pass through light receiving surface 302 and then pass through conically-shaped surface 322 at different angles. Some light rays 330 pass through light receiving surface 102 and then exit optical element 300 through one or both of the pair of frustoconical surfaces 340 and 342.

A lighting apparatus incorporating optical element 300 and one or more LEDs 115, 117, and 119 positioned adjacent thereto may also include a diffuser similar to diffuser 136 shown in FIG. 13 with the exemplary embodiment 100. Optical element 300 is equipped with a plurality of legs 344 that may be used to position and support element 300.

As with previous embodiments, optical element 300 is configured to provide a more uniform distribution of light than is available from an LED light source. In a manner similar to that discussed above using FIG. 6, optical element 100 and the surfaces described above are configured so that the variation in light intensity measured at different angles from central axis CA over the range of zero to 135 degrees is not more than±twenty percent from the average light intensity measured at such fixed distance from zero to 135 degrees. In another exemplary embodiment, such variation in light intensity is not more than±ten percent from the average light intensity.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A lighting apparatus, comprising:
   at least one light emitting diode;
   an optical element positioned adjacent to said at least one light emitting diode, said optical element defining a central axis and a lateral axis that is substantially orthogonal to the central axis, said optical element extending circumferentially about the central axis and comprising:
      a convex light receiving surface that is substantially symmetrical about the central axis and positioned adjacent to said at least one light emitting diode;
      a frustoconical light projecting surface positioned laterally outside of the convex light receiving surface and substantially symmetrical about the central axis; and
      an arcuate light reflecting surface positioned laterally inside of the frustoconical light projecting surface and substantially symmetrical about the central axis, the arcuate light reflecting surface spaced apart along the central axis from the convex light receiving surface;
   wherein the optical element distributes the light output from the at least one light emitting diode into a substantially omnidirectional output.

2. A lighting apparatus as in claim 1, wherein said optical element further comprises a conically-shaped surface configured in a substantially symmetrical manner about the central axis and connected to said arcuate light reflecting surface.

3. A lighting apparatus as in claim 1, wherein the conically-shaped surface comprises a flute extending circumferentially about the central axis.

4. A lighting apparatus as in claim 1, wherein said arcuate light reflecting surface is metallized.

5. A lighting apparatus as in claim 1, wherein said arcuate light reflecting surface is coated with a highly reflective material.

6. A lighting apparatus as in claim 1, wherein said optical element further comprises
   a planar light projecting surface that lies in a plane substantially perpendicular to the central axis and substantially parallel to the lateral axis, the planar light projecting surface connected with the frustoconical light projecting surface and the arcuate light reflecting surface, the planar light projecting surface extending circumferentially about the central axis.

7. A lighting apparatus as in claim 6, wherein the planar light projecting surface comprises a flute extending circumferentially about the central axis.

8. A lighting apparatus as in claim 1, further comprising a diffuser positioned around said optical element and said at least one light emitting diode, said diffuser configured for scattering light rays received from said optical element and said at least one light emitting diode.

9. A lighting apparatus, comprising:
at least one light emitting diode;
an optical element positioned adjacent to said at least one light emitting diode, said optical element defining a central axis and a lateral axis that is substantially orthogonal to the central axis, said optical element extending circumferentially about the central axis and comprising:
  a light receiving surface that is substantially symmetrical about the central axis and positioned adjacent to said at least one light emitting diode, the light receiving surface forming an acute angle with the central axis;
  a light projecting surface that is substantially symmetrical about the central axis and spaced apart from the light receiving surface along the central axis;
  a frustoconical surface connected with the light projecting surface and that is substantially symmetrical about the central axis; and
  an arcuate light reflecting surface positioned laterally inside of the frustoconical surface and that is substantially symmetrical about the central axis, the arcuate light reflecting surface spaced apart along the central axis from the light receiving surface;
wherein said lighting apparatus further comprises a diffuser positioned around said optical element and said at least one light emitting diode, said diffuser configured for scattering light rays received from said optical element and said at least one light emitting diode.

10. A lighting apparatus as in claim 9, wherein said optical element is configured so that light from said at least one light emitting diode is emitted from said optical element with variation in light intensity measured at different angles from central axis CA over the angular range of zero to 135 degrees that is not more than ±twenty percent from the average light intensity measured over the angular range from zero to 135 degrees.

11. A lighting apparatus as in claim 9, wherein the light projecting surface is frustoconical and forms an obtuse angle with the central axis.

12. A lighting apparatus as in claim 9, wherein the light projecting surface is convex.

13. A lighting apparatus as in claim 9, wherein said optical element further comprises a conically-shaped surface located in a substantially symmetrical manner along the central axis and connected to said arcuate light reflecting surface.

14. A lighting apparatus as in claim 9, wherein said arcuate light reflecting surface is metallized.

15. A lighting apparatus as in claim 9, wherein said arcuate light reflecting surface is coated with a highly reflective material.

16. A lighting apparatus as in claim 9, further comprising a plurality of legs extending from the light receiving surface and configured for supporting the optical element.

17. An optical element for a lighting apparatus having at least one light emitting diode, the optical element for positioning adjacent to the at least one light emitting diode, the optical element defining a central axis and a lateral axis that is substantially orthogonal to the central axis, the optical element extending circumferentially about the central axis, the optical element comprising:
  a light receiving surface that extends circumferentially about the central axis and is configured for positioning near the at least one light emitting diode;
  a frustoconical surface spaced apart from the light receiving surface along the transverse direction and extending circumferentially about the central axis in a substantially symmetrical manner;
  an arcuate light reflecting surface positioned laterally inside of the frustoconical surface and extending circumferentially about the central axis in a substantially symmetrical manner; and
  wherein said optical element is configured so that light from said at least one light emitting diode is emitted from said optical element with variation in light intensity measured at a fixed distance from central axis CA over the range of zero to 135 degrees that is not more than ±twenty percent from the average light intensity measured over the angular range from zero to 135 degrees.

18. A lighting apparatus, comprising:
at least one light emitting diode;
an optical element positioned adjacent to said at least one light emitting diode, said optical element defining a central axis and a lateral axis that is substantially orthogonal to the central axis, said optical element extending circumferentially about the central axis and comprising:
  a convex light receiving surface that is substantially symmetrical about the central axis and positioned adjacent to said at least one light emitting diode;
  a frustoconical light projecting surface positioned laterally outside of the convex light receiving surface and substantially symmetrical about the central axis; and
  an arcuate light reflecting surface positioned laterally inside of the frustoconical light projecting surface and substantially symmetrical about the central axis, the arcuate light reflecting surface spaced apart along the central axis from the convex light receiving surface;
wherein said optical element is configured so that light from said at least one light emitting diode is emitted from said optical element with variation in light intensity measured at different angles from central axis CA over the angular range of zero to 135 degrees that is not more than ±twenty percent from the average light intensity measured over the angular range from zero to 135 degrees.

* * * * *